(12) United States Patent
Matsumoto et al.

(10) Patent No.: US 9,948,116 B2
(45) Date of Patent: Apr. 17, 2018

(54) POWER STORAGE SYSTEM

(71) Applicant: TOYOTA JIDOSHA KABUSHIKI KAISHA, Toyota-shi, Aichi-ken (JP)

(72) Inventors: Junichi Matsumoto, Toyota (JP); Takashi Ogura, Miyoshi (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 117 days.

(21) Appl. No.: 15/025,106

(22) PCT Filed: Sep. 29, 2014

(86) PCT No.: PCT/IB2014/001958
§ 371 (c)(1),
(2) Date: Mar. 25, 2016

(87) PCT Pub. No.: WO2015/049568
PCT Pub. Date: Apr. 9, 2015

(65) Prior Publication Data
US 2016/0241054 A1    Aug. 18, 2016

(30) Foreign Application Priority Data
Oct. 1, 2013    (JP) .................................. 2013-206843

(51) Int. Cl.
*H02J 7/00*    (2006.01)
*H01M 10/48*    (2006.01)
(Continued)

(52) U.S. Cl.
CPC .......... *H02J 7/0016* (2013.01); *B60L 3/0046* (2013.01); *B60L 3/12* (2013.01); *B60L 7/12* (2013.01);
(Continued)

(58) Field of Classification Search
CPC .. H02J 7/0016; H02J 7/0021; H01M 10/0525; H01M 10/34; H01M 10/46; H01M 10/425; H01M 10/48; B60L 11/1866
(Continued)

(56) References Cited

U.S. PATENT DOCUMENTS

2011/0316520 A1    12/2011    Kawahara et al.
2013/0026989 A1    1/2013    Gibbs et al.
2014/0015475 A1    1/2014    Nakao

FOREIGN PATENT DOCUMENTS

EP    2400626 A2    12/2011
JP    2001-218376 A    8/2001
(Continued)

*Primary Examiner* — Sun Lin
(74) *Attorney, Agent, or Firm* — Sughrue Mion, PLLC

(57) ABSTRACT

A power storage system includes a power storage device and a controller. The power storage device includes a plurality of power storage stacks connected in series. The controller controls a discharge processing based on voltage values of power storage elements in each power storage stack. The controller determines an abnormal state according to a voltage fluctuation after the voltage values are made uniform. The controller performs a first processing when the following conditions i) and ii) are satisfied and performs a second processing when the following conditions i) and iii) are satisfied. The condition i) is that the power storage elements included in the plurality of power storage stacks are divided into a plurality of groups, each group consists of the power storage elements included in a same power storage stack. The condition ii) is that the voltage values of the power storage elements are different in each group. The condition iii) is that, in the plurality of groups in each of which the voltage values are made uniform, the voltage values are different among the plurality of groups.

5 Claims, 7 Drawing Sheets

(51) Int. Cl.

| | |
|---|---|
| *H01M 10/46* | (2006.01) |
| *H01M 10/42* | (2006.01) |
| *H01M 10/0525* | (2010.01) |
| *H01M 10/34* | (2006.01) |
| *B60L 3/00* | (2006.01) |
| *B60L 3/12* | (2006.01) |
| *B60L 7/12* | (2006.01) |
| *B60L 11/18* | (2006.01) |
| *H01M 10/44* | (2006.01) |
| *G01R 31/36* | (2006.01) |

(52) U.S. Cl.
CPC ....... *B60L 11/1805* (2013.01); *B60L 11/1866* (2013.01); *H01M 10/0525* (2013.01); *H01M 10/34* (2013.01); *H01M 10/425* (2013.01); *H01M 10/441* (2013.01); *H01M 10/46* (2013.01); *H01M 10/48* (2013.01); *H01M 10/482* (2013.01); *H02J 7/0021* (2013.01); *B60L 2240/545* (2013.01); *B60L 2240/547* (2013.01); *B60L 2240/549* (2013.01); *B60L 2240/80* (2013.01); *G01R 31/3658* (2013.01); *H01M 2010/4271* (2013.01); *H01M 2220/20* (2013.01); *Y02T 10/7005* (2013.01); *Y02T 10/7061* (2013.01)

(58) Field of Classification Search
USPC ......................................................... 320/118
See application file for complete search history.

(56) References Cited

FOREIGN PATENT DOCUMENTS

| | | |
|---|---|---|
| JP | 2002-246073 A | 8/2002 |
| JP | 2010-263703 A | 11/2010 |
| JP | 2012-010562 A | 1/2012 |
| JP | 2012-054034 A | 3/2012 |
| WO | 2012/132414 A1 | 10/2012 |

POWER STORAGE SYSTEM

BACKGROUND OF THE INVENTION

1. Field of the Invention

The present invention relates to a technique for detecting voltage values of a plurality of power storage elements and discharging power storage elements to suppress variation of the voltage values in a plurality of power storage elements.

2. Description of Related Art

Japanese Patent Application Publication No. 2001-218376 (JP 2001-218376 A) describes a technique for detecting voltage values of a plurality of cells connected in series and discharging a specific cell such that variation of the voltage values in a plurality of cells falls within an allowable range. In each of the cells, a discharge resistor and a discharge switch are connected in parallel, and a specific discharge switch is turned on, thereby discharging only the specific cell.

As in JP 2001-218376 A, if variation of the voltage values in a plurality of cells is within the allowable range, the abnormal state according to voltage fluctuation can be easily specified by monitoring voltage fluctuation thereafter. If a specific abnormal state is generated, there is a case where voltage fluctuation due to the abnormal state is generated. Therefore, it is possible to determine the generation of the abnormal state by recognizing voltage fluctuation due to the abnormal state. When variation of the voltage values is generated, it is difficult to recognize voltage fluctuation due to an abnormal state. Therefore, it is preferable that variation of the voltage values is within the allowable range.

In JP 2001-218376 A, all cells constituting an assembled battery are connected to one voltage detection circuit. The number of cells constituting the assembled battery is able to be appropriately determined. For example, if the number of cells increases, there is a case where a plurality of voltage detection circuits should be connected to the assembled battery. The detection result of each of the voltage detection circuits optionally includes a detection error, and the detection error is optionally different among the voltage detection circuits. Accordingly, there is a case where variation of the voltage values of the cells in the assembled battery is generated by variation in the detection error of a plurality of voltage detection circuits.

If the cells are discharged such that variation of the voltage values associated with variation in the detection error falls within the allowable range, the time until variation of the voltage values falls within the allowable range is delayed by the discharge time. Accordingly, the determination of the abnormal state described above is delayed.

For example, there is a case where, in order to improve the output of an assembled battery, a plurality of battery stacks are connected in series to constitute the assembled battery. Each battery stack is constituted by connecting a plurality of cells in series. Each battery stack is replaced individually or a plurality of battery stacks are used in different temperature environments, and thus, in the plurality of battery stacks, variation in the full charging capacity of the cells is generated. Accordingly, in the plurality of battery stacks, variation of the voltage values of the cells is likely to be generated.

If the cells are discharged such that variation of the voltage values falls within the allowable range, the time until variation of the voltage values falls within the allowable range is delayed by the discharge time. Accordingly, the determination of the abnormal state described above is delayed.

SUMMARY OF THE INVENTION

A power storage system according to a first aspect of the invention has a power storage device, a plurality of voltage detection circuits, a discharge circuit, and a controller. The power storage device includes a plurality of power storage stacks connected in series, each power storage stack of said plurality of power storage stacks includes a plurality of power storage elements connected in series. The plurality of voltage detection circuits is configured to detect voltage values of the plurality of power storage elements, respectively. The discharge circuit is configured to perform a discharge processing for discharging each power storage element. The controller is configured to control the discharge processing based on the voltage values detected by the voltage detection circuits. The controller is configured to determine an abnormal state according to a voltage fluctuation after the voltage values are made uniform. The controller is configured to perform a first processing when conditions i) to iv) given below are satisfied, and to perform a second processing when all the conditions i) to iii) and a condition v) given below are satisfied. The condition i) is that in at least one power storage stack, different voltage detection circuits are connected to the power storage elements included in said at least one power storage stack. The condition ii) is that at least one voltage detection circuit is connected to the power storage elements of different power storage stacks. The condition iii) is that the power storage elements included in the plurality of power storage stacks are divided into a plurality of groups, each group consists of a plurality of power storage elements included in a same power storage stack and connected to a same voltage detection circuit. The condition iv) is that the voltage values of the power storage elements are different in each group. The condition v) is that in the plurality of groups in each of which the voltage values of the power storage elements are made uniform, the voltage values are different among the plurality of groups. The first processing is processing for making the voltage values of the power storage elements in the group corresponding to the condition iv) uniform by the discharge processing. The second processing is processing for making the voltage values of the power storage elements included in the plurality of groups corresponding to the condition v) uniform by the discharge processing.

According to the first aspect of the invention, it is possible to make the voltage value of all power storage elements in a power storage device by discharge processing (first and second processing) of the discharge circuit uniform. Specifically, it is possible to make the voltage values among a plurality of groups uniform by the second processing while making the voltage values in the group uniform by the first processing. With this, in the power storage device, it is possible to make uniform the voltage values of all power storage elements.

Here, one group is divided for each voltage detection circuit. With this, the voltage values of the power storage elements included in each group are not affected by the detection errors in the voltage detection circuits. Accordingly, it is possible to make the voltage values in the group uniform without regard for variation of the voltage values associated with variation in the detection error of the voltage detection circuits. Furthermore, one group is divided for each power storage stack. With this, the voltage values of the power storage elements in each group are not affected by variation in the full charging capacity apt to be generated among a plurality of power storage stacks. Accordingly, it is possible to make the voltage values in the group uniform without regard for variation of the voltage values associated with variation in the full charging capacity in a plurality of power storage stacks.

When making the voltage values in the group uniform, it is not necessary to suppress variation of the voltage values associated with variation in the detection error or full charging capacity, and discharge processing for suppressing variation is not required. With this, it becomes easy to reduce the time until the voltage values of the power storage elements in each group are made uniform, and it is possible to suppress delay of the determination of an abnormal state. If the voltage values in the group are made uniform, in the second processing, it is possible to discharge all power storage elements in the group in a state in which the voltage values are made uniform. Accordingly, it is possible to make the voltage values of all power storage elements in the power storage device uniform while performing the determination of an abnormal state in the group.

A power storage system according to a second aspect of the invention has a power storage stack, a plurality of voltage detection circuits, a discharge circuit, and a controller. The power storage stack includes a plurality of power storage elements connected in series. The plurality of voltage detection circuits is connected to different power storage elements in the power storage stack. The plurality of voltage detection circuits is configured to detect voltage values of the plurality of power storage elements, respectively. The discharge circuit is configured to perform a discharge processing for discharging each power storage element. The controller is configured to control the discharge processing based on the voltage values detected by the voltage detection circuits. The controller is configured to determine an abnormal state according to a voltage fluctuation after the voltage values are made uniform. The controller is configured to perform a first processing when conditions i) and ii) are satisfied, and to perform a second processing when the condition i) and a condition iii) are satisfied. The condition i) is that the power storage elements are divided into a plurality of groups, each group consists of a plurality of power storage elements connected to a same voltage detection circuit. The condition ii) is that the voltage values of the power storage elements are different in each group. The condition iii) is that in the plurality of groups in each of which the voltage values of the power storage elements are made uniform, the voltage values are different among the plurality of groups. The first processing is processing for making the voltage values of the power storage elements in the group corresponding to the condition ii) uniform by the discharge processing. The second processing is processing for making the voltage values of the power storage elements included in the plurality of groups corresponding to the condition iii) uniform by the discharge processing.

In the second aspect, as in the first aspect, the voltage values among a plurality of groups are made uniform while making the voltage values in the group uniform, whereby it is possible to make the voltage values of all power storage elements in the power storage device uniform.

Here, one group is divided for each voltage detection circuit, and thus, as in the first aspect, it is possible to make the voltage values in the group uniform without regard for variation of the voltage values associated with variation in the detection error of the voltage detection circuits. Then, it becomes easy to reduce the time until the voltage values of the power storage elements are made uniform in each group, and it is possible to suppress delay of the determination of an abnormal state. If the voltage values in the group are made uniform, in the second processing, it is possible to discharge all power storage elements in the group in a state in which the voltage values are made uniform. Accordingly, it is possible to make the voltage values of all power storage elements in the power storage device uniform while performing the determination of an abnormal state in the group. The power storage device includes a plurality of power storage stacks connected in series, each of the power storage stacks including a plurality of power storage elements connected in series. The voltage detection circuit is configured to detect a voltage value of each power storage element. The discharge circuit is configured to perform discharge processing for discharging each power storage element. The controller is configured to control the discharge processing based on the voltage values detected by the voltage detection circuits. The controller is configured to determine an abnormal state according to voltage fluctuation after the voltage values are made uniform. The controller is configured to perform first processing when the following conditions i) and ii) are satisfied, and to perform second processing when the condition i) and a condition iii) are satisfied. The condition i) is that the power storage elements are divided into a plurality of groups, each group having each power storage stack. The condition ii) is that the voltage values of the power storage elements are different in each group. The condition iii) is that in the plurality of groups in each of which the voltage values of the power storage elements are made uniform, the voltage values are different among the plurality of groups. The first processing is processing for making the voltage values of the power storage elements in the group corresponding to the condition ii) uniform by the discharge processing. The second processing is processing for making the voltage values of the power storage elements included in the plurality of groups corresponding to the condition iii) uniform by the discharge processing.

A power storage system according to a third aspect of the invention has a power storage device, a voltage detection circuit, a discharge circuit, and a controller.

In the third aspect, as in the first aspect, the voltage values among a plurality of groups are made uniform while making the voltage values in the group uniform, whereby it is possible to make the voltage values of all power storage elements in the power storage device uniform.

Here, one group is divided for each power storage stack, and thus, as in the first aspect, it is possible to make the voltage values in the group uniform without regard for variation of the voltage values associated with variation in the full charging capacity. Then, it becomes easy to reduce the time until the voltage values of the power storage elements are made uniform in each group, and it is possible to suppress delay of the determination of an abnormal state. If the voltage values in the group are made uniform, in the second processing, it is possible to discharge all power storage elements in the group in a state in which the voltage values are made uniform. Accordingly, it is possible to make the voltage values of all power storage elements in the power storage device uniform while performing the determination of an abnormal state in the group.

In the first to third aspects of the invention, as an abnormal state, there is failure of a Zener diode associated with the flowing of a leakage current in the Zener diode.

With the above-described configuration, the voltage values of the power storage elements in the group are made uniform with a reference voltage value, making it easy to recognize the above-described voltage fluctuation associated with failure of the Zener diode.

In the first to third aspects of the invention, as an abnormal state, there is a state in which a power storage element continues to be discharged. With the above-described configuration, the voltage values of the power storage elements in the group are made uniform, making it easy to recognize a decrease of the voltage value in a specific power storage element and to recognize a state in which a power storage element continues to be discharged.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an example of the invention will be described.

Figure 1:
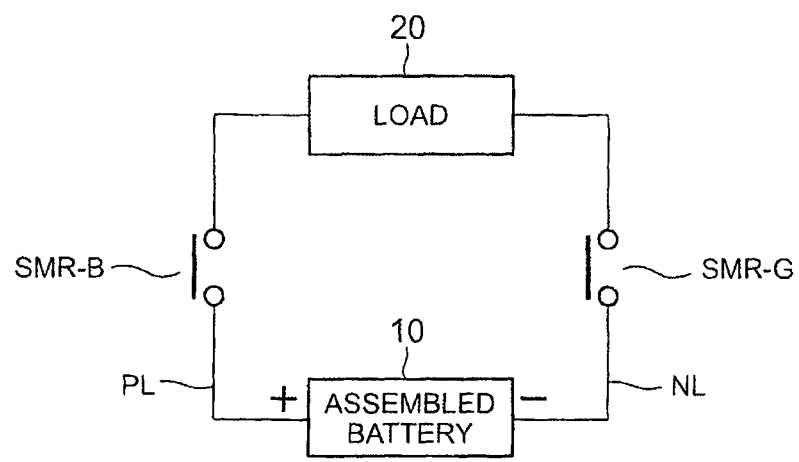
FIG. 1 is a diagram illustrating the configuration of a battery system.

FIG. 1 is a diagram illustrating the configuration of a battery system of this example. The battery system is an example of a power storage system of the invention. An assembled battery 10 is connected to a load 20 through a positive electrode line PL and a negative electrode line NL. The assembled battery is an example of a power storage device of the invention. The positive electrode line PL is connected to a positive electrode terminal of the assembled battery 10, and the negative electrode line NL is connected to a negative electrode terminal of the assembled battery 10.

A system main relay SMR-B is provided in a positive electrode line PL, and a system main relay SMR-G is provided in a negative electrode line NL. When the system main relays SMR-B, SMR-G are turned on, the assembled battery 10 is connected to the load 20. When the system main relays SMR-B, SMR-G are turned off, the connection of the assembled battery 10 and the load 20 is interrupted.

The battery system illustrated in FIG. 1 is able to be mounted in, for example, a vehicle. In this case, a motor generator is able to be used as the load 20. The motor generator receives power output from the assembled battery 10 and generates kinetic energy for making the vehicle travel. The motor generator is able to convert kinetic energy generated at the time of braking of the vehicle to power and is able to output power to the assembled battery 10.

Next, the configuration of the assembled battery 10 will be described referring to FIG. 2. The assembled battery 10 has three battery stacks 11 (11A to 11C) connected in series. The battery stacks are an example of power storage stacks of the invention. In this example, the number of battery stacks 11 constituting the assembled battery 10 is optionally a plural number. The battery stacks 11A to 11C are able to be replaced individually.

For example, when only the battery stack 11B reaches the life end due to deterioration, only the battery stack 11B is able to be replaced with a different battery stack 11. The different battery stack 11 is connected in series with the battery stacks 11A and 11C being previously used. As the different battery stack 11, a new battery stack 11 or a used battery stack 11 is able to be used. The used battery stack 11 is a battery stack 11, which has not yet reached the life end and is able to be continuously used, among recovered battery stacks 11.

Each of the battery stacks 11A to 11C has a plurality of cells 12 connected in series. The cells are an example of power storage elements of the invention. The number of cells 12 constituting the battery stack 11 is able to be appropriately set. The battery stack 11 optionally includes a plurality of cells 12 connected in parallel. As the cells 12, a secondary battery, such as a nickel-hydrogen battery or a lithium ion battery, is optionally used. Instead of the secondary battery, an electric double layer capacitor is optionally used.

The positive electrode terminal and the negative electrode terminal of each cell 12 are connected to a monitoring unit 30 (30A, 30B) through detection lines DL. The monitoring unit 30 is used to detect a voltage value Vb of each cell 12, and an output signal of the monitoring unit 30 is input to a controller 40. In this example, although two monitoring units 30A, 30B are connected to the assembled battery 10, the number of monitoring units 30 is optionally a plural number.

Figure 2:
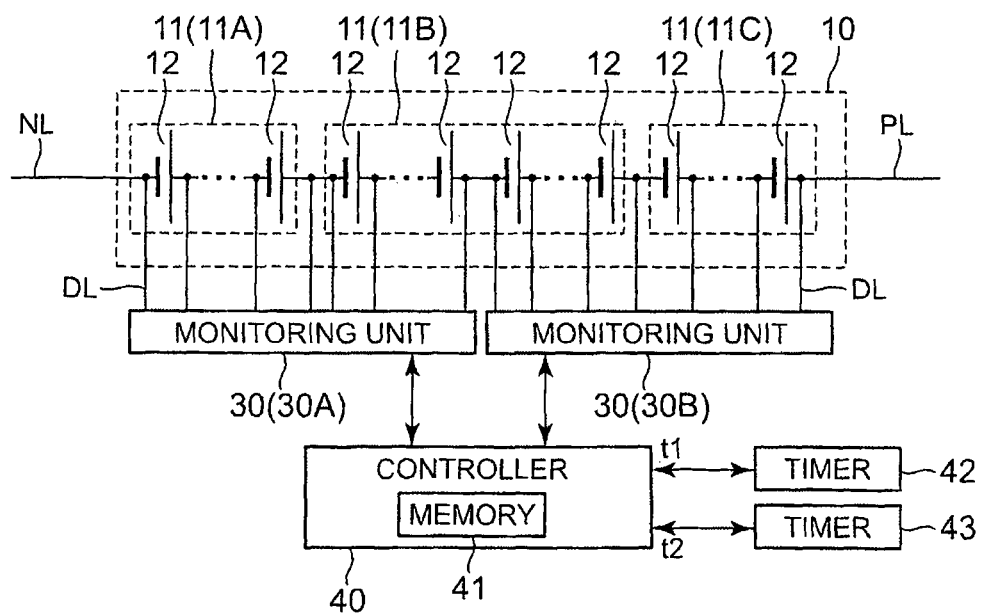
FIG. 2 is a diagram illustrating an assembled battery and a monitoring unit.

In the configuration illustrated in FIG. 2, the monitoring unit 30A is connected to all cells 12 of the battery stack 11A and some cells 12 of the battery stack 11B. The monitoring unit 30B is connected to all cells 12 of the battery stack 11C and some cells 12 of the battery stack 11B. The battery stack 11B includes the cells 12 connected to the monitoring unit 30A and cells 12 connected to the monitoring unit 30B.

The controller 40 has a memory 41, and the memory 41 stores various kinds of information. The memory 41 is optionally provided outside the controller 40. The controller 40 is able to output a control signal for switching the system main relays SMR-B, SMR-G illustrated in FIG. 1 between on and off. A timer 42 measures the time t1 and outputs the measurement result to the controller 40. A timer 43 measures the time t2 and outputs the measurement result to the controller 40. The details of the time t1, t2 will be described below.

Figure 3:
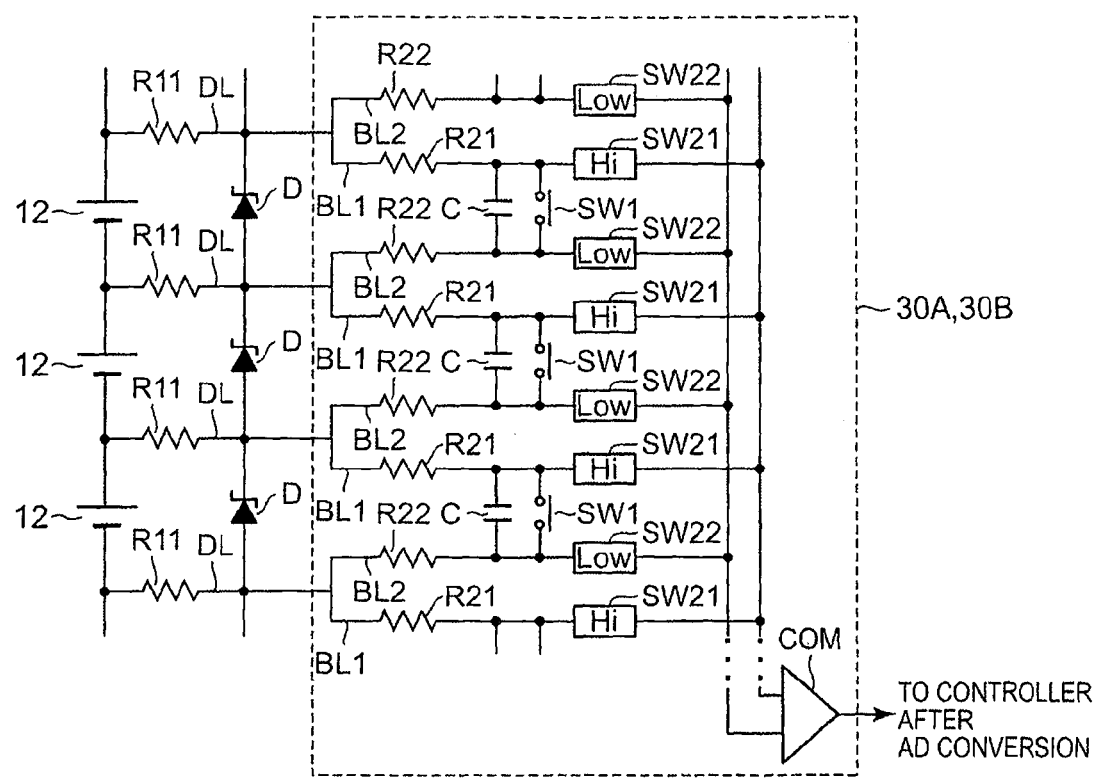
FIG. 3 is a diagram illustrating the circuit configuration of a part in a monitoring unit.

Next, the circuit configuration of the monitoring unit 30 (30A, 30B) will be described referring to FIG. 3. FIG. 3 illustrates the circuit configuration of a part in the monitoring unit 30.

A resistive element R11 is provided in each detection line DL. When a current that is greater than an allowable current value flows in the resistive element R11, the resistive element R11 is fused, whereby the connection of the monitoring unit 30 and the assembled battery 10 is able to be interrupted. With this, it is possible to suppress the flowing of an excessive current from the assembled battery 10 into the monitoring unit 30.

A Zener diode D is connected in parallel with each cell 12 through two detection lines DL. The cathode of the Zener diode D is connected to the positive electrode terminal of the cell 12, and the anode of the Zener diode D is connected to the negative electrode terminal of the cell 12. The Zener diode D is used to suppress the application of an overvoltage from the assembled battery 10 to the monitoring unit 30. That is, when an overvoltage is applied from the assembled battery 10 to the monitoring unit 30, a current flows from the cathode to the anode of the Zener diode D, thereby suppressing the application of an overvoltage to the monitoring unit 30. A plurality of Zener diodes D are connected in series.

Each detection line DL is branched into two lines, and the branch lines BL1, BL2 are respectively provided with resistive elements R21, R22. The Zener diode D is connected to a connection point of the resistive elements R21, R22 and the resistive element R11. In the two detection lines DL connected to the cell 12, a capacitor (flying capacitor) C and a switch SW1 are connected to the branch line BL1 of one detection line DL and the branch line BL2 of the other detection line DL.

Specifically, the capacitor C and the switch SW1 are connected to the branch line BL1 between the resistive element R21 and a sampling switch SW21 and to the branch line BL2 between the resistive element R22 and a sampling switch SW22. The sampling switches SW21, SW22 receive a control signal from the controller 40 and are switched between on and off.

The switch SW1 receives a control signal from the controller 40 and is switched between on and off. Each switch SW1 is connected in parallel with each cell 12 through the detection line DL, and when the switch SW1 is turned on, a closed circuit is constituted by the switch SW1, the cell 12, and the detection line DL, thereby discharging the cell 12. A discharge current of the cell 12 flows in the resistive elements R11, R21, R22, whereby it is possible to lower the voltage value Vb of the cell 12.

Since each capacitor C is connected in parallel with each cell 12 through the detection line DL, the capacitor C is charged with electric charges stored in the cell 12. With this, a voltage value Vc of the capacitor C becomes equal to the voltage value Vb of the cell 12.

The sampling switches SW21, SW22 corresponding to a specific cell 12 are turned on, whereby it is possible to detect the voltage value Vb of the specific cell 12. That is, the voltage value Vc of the capacitor C is detected. The sampling switch SW21 is connected to one input terminal comparator COM, and the sampling switch SW22 is connected to the other input terminal of the comparator COM. An output signal of the comparator COM is subjected to AD conversion and then input to the controller 40. With this, the controller 40 is able to detect the voltage value Vb (voltage value Vc) of each cell 12.

The controller 40 sequentially turns on the sampling switches SW21, SW22 corresponding to each cell 12, thereby sequentially detecting the voltage value Vb (voltage value Vc) of each cell 12. A plurality of sampling switches SW21, SW22 are able to be constituted by a multiplexer.

As described above, the switch SW1 is turned on and the cell 12 is discharged, whereby it is possible to suppress variation of the voltage values Vb (voltage value Vc) in a plurality of cells 12. Processing for suppressing variation of the voltage values Vb is referred to as equalization processing.

As described above, the monitoring unit 30 of this example has a circuit (voltage detection circuit) that detects the voltage value Vb of each cell 12, and a circuit (discharge circuit) that discharges each cell 12. The voltage detection circuit and the discharge circuit are optionally constituted separately. Specifically, the voltage detection circuit is able to be connected to each cell 12, and the discharge circuit is able to be connected to each cell 12 using a connection line different from a connection line of the voltage detection circuit and each cell 12. The voltage detection circuits are provided corresponding to the number of monitoring units 30. The number of discharge circuits is able to be appropriately set, and for example, the discharge circuits are able to be provided corresponding to the number of monitoring units 30.

Figure 4:
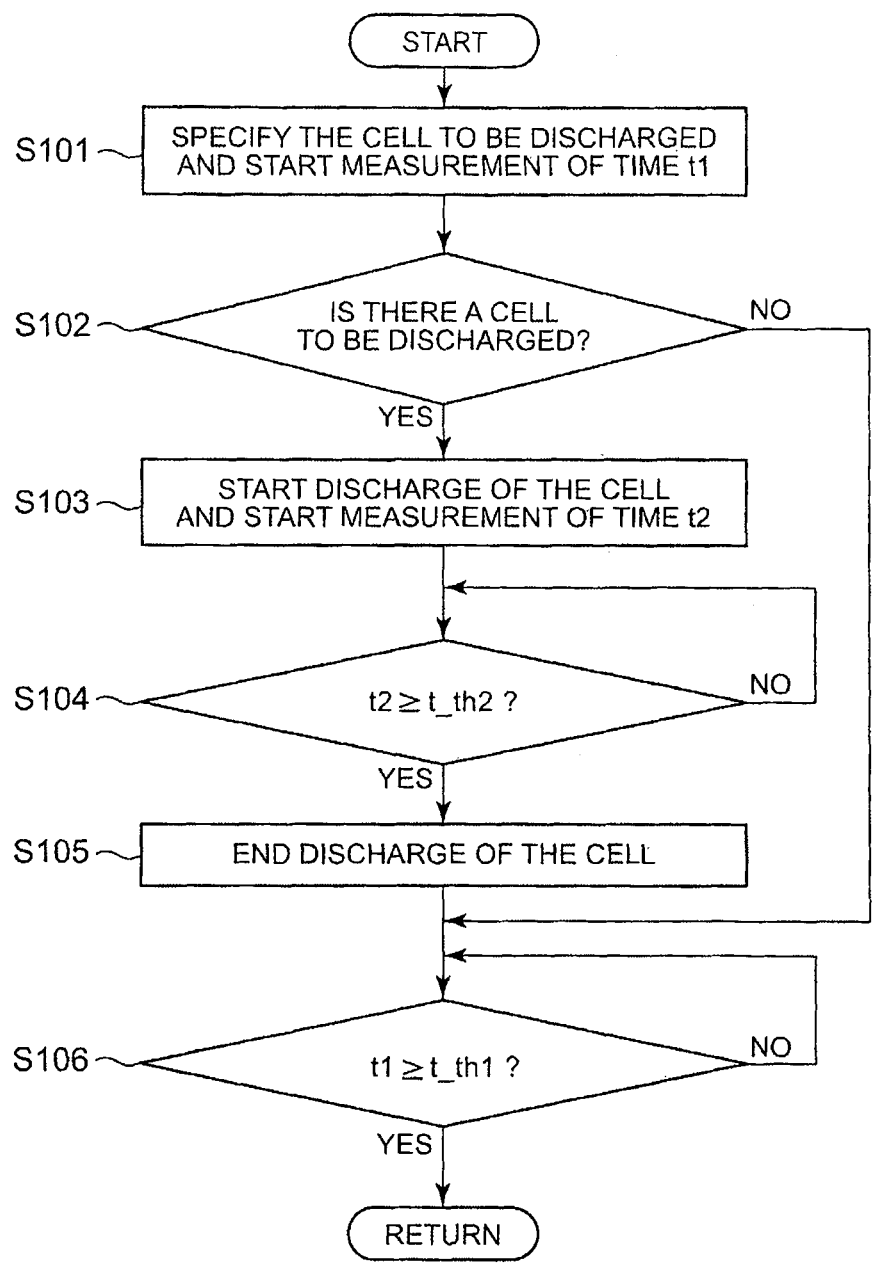
FIG. 4 is a flowchart illustrating equalization processing.

Next, the equalization processing will be described using the flowchart illustrated in FIG. 4. Processing illustrated in FIG. 4 is executed by the controller 40, and for example, the processing illustrated in FIG. 4 is able to be performed while the assembled battery 10 is not connected to the load 20. The controller 40 is able to be operated with power supplied from a power supply different from the assembled battery 10.

In Step S101, the controller 40 specifies a cell 12 that is discharged by the equalization processing, and the measurement of the time t1 starts using the timer 42. When performing processing of Step S101, there is optionally no cell 12 to be discharged, and in this case, a cell 12 to be discharged is not specified. The details of the processing for specifying a cell 12 to be discharged will be described below.

In Step S102, the controller 40 performs determination about whether or not there is a cell 12 to be discharged based on the result of the processing of Step S101. When a cell 12 to be discharged is specified, the controller 40 performs processing of Step S103, and when a cell 12 to be discharged is not specified, the controller 40 performs processing of Step S106.

In Step S103, the controller 40 starts discharging for the cell 12 specified by the processing of Step S101. Specifically, the controller 40 switches the switch SW1 (see FIG. 3) corresponding to the specified cell 12 from off to on, thereby discharging the cell 12. The switch SW1 corresponding to a cell 12 not to be discharged remains off. When the discharging of the cell 12 starts, the controller 40 starts the measurement of the time t2 using the timer 43. The measured time t2 represents the time when the switch SW1 is turned on and the cell 12 continues to be discharged.

In Step S104, the controller 40 performs determination about whether or not the measured time t2 is equal to or greater than a second predetermined time t_th2. The second predetermined time t_th2 is able to be appropriately set, and information specifying the second predetermined time t_th2 is able to be stored in the memory 41. The controller 40 waits until the measured time t2 becomes equal to or greater than the second predetermined time t_th2 after the discharging of the cell 12 starts.

When the measured time t2 is equal to or greater than the second predetermined time t_th2, the controller 40 ends the discharging of the cell 12 in Step S105. Specifically, the controller 40 switches the switch SW1, which is turned on by the processing of Step S103, to off. When ending the discharging of the cell 12, the controller 40 resets the measured time t2.

In Step S106, the controller 40 performs determination about whether or not the time t1 that starts to be measured by the processing of Step S101 is equal to or greater than a first predetermined time t_th1. The first predetermined time t_th1 is the time that specifies the execution period of the processing of Step S101, and is equal to or greater than the second predetermined time t_th2. Information specifying the first predetermined time t_th1 is able to be stored in the memory 41.

The controller 40 waits until the measured time t1 becomes equal to or greater than the first predetermined time t_th1, and when the measured time t1 is equal to or greater than the first predetermined time t_th1, the controller 40 resets the measured time t1 and then performs the processing of Step S101 again.

Figure 5:
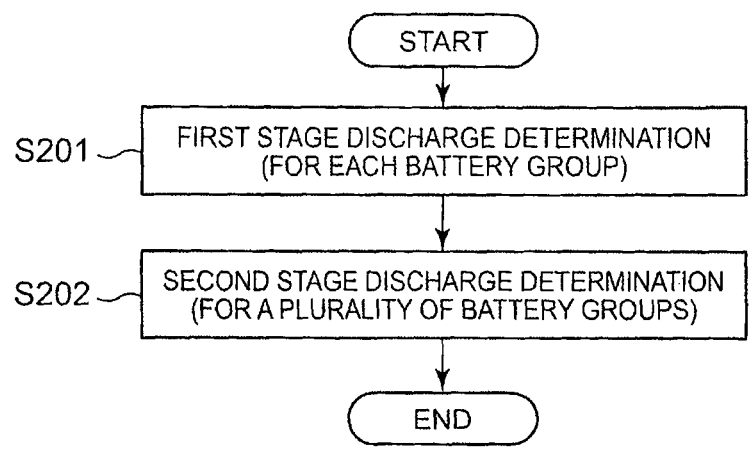
FIG. 5 is a flowchart illustrating discharge determination.

Next, the processing of Step S101 illustrated in FIG. 4, that is, the details of the processing for specifying a cell 12 to be discharged will be described using the flowchart illustrated in FIG. 5. Processing illustrated in FIG. 5 is executed by the controller 40.

Figure 6:
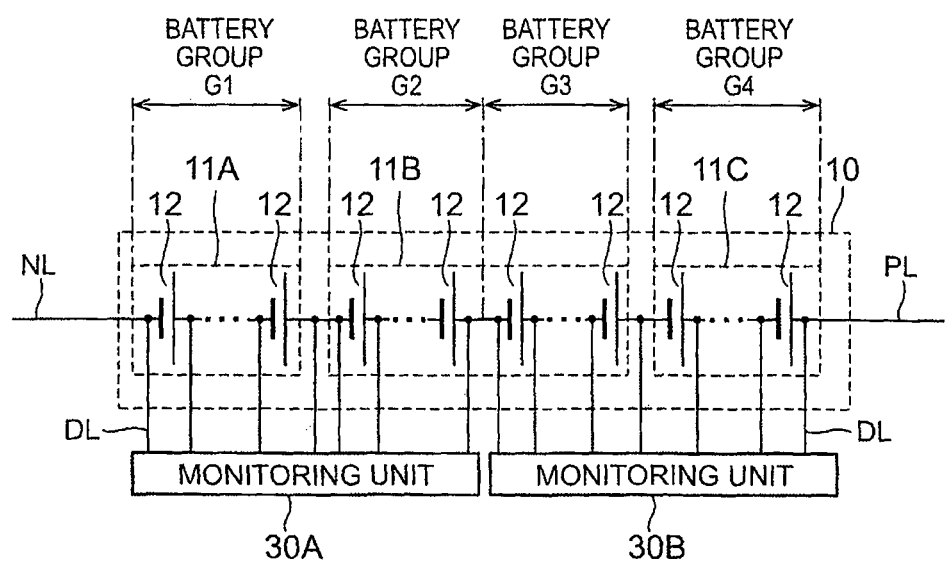
FIG. 6 is a diagram illustrating battery groups.

In Step S201, as first stage discharge determination, the controller 40 specifies a cell 12 to be discharged in each battery group G. The battery groups are an example of groups of the invention. As illustrated in FIG. 6, an assembled battery 10 is divided into four battery groups G (G1 to G4).

Each of the battery groups G1 to G4 has cells 12 that are included in the same battery stack 11 (11A to 11C) and are connected to the same monitoring unit 30 (30A, 30B). In the configuration illustrated in FIG. 6, although the number of battery groups G1 to G4 is four, the invention is not limited thereto. The number of battery groups changes depending on the number of battery stacks 11 or the number of monitoring units 30. The details of the processing of Step S201 will be described below.

In Step S202, as second stage discharge determination, the controller 40 specifies cells 12 to be discharged in each of the battery groups G1 to G4. The cells 12 to be discharged are all cells 12 included in the battery group G. The details of the processing of Step S202 will be described below.

Figure 7:
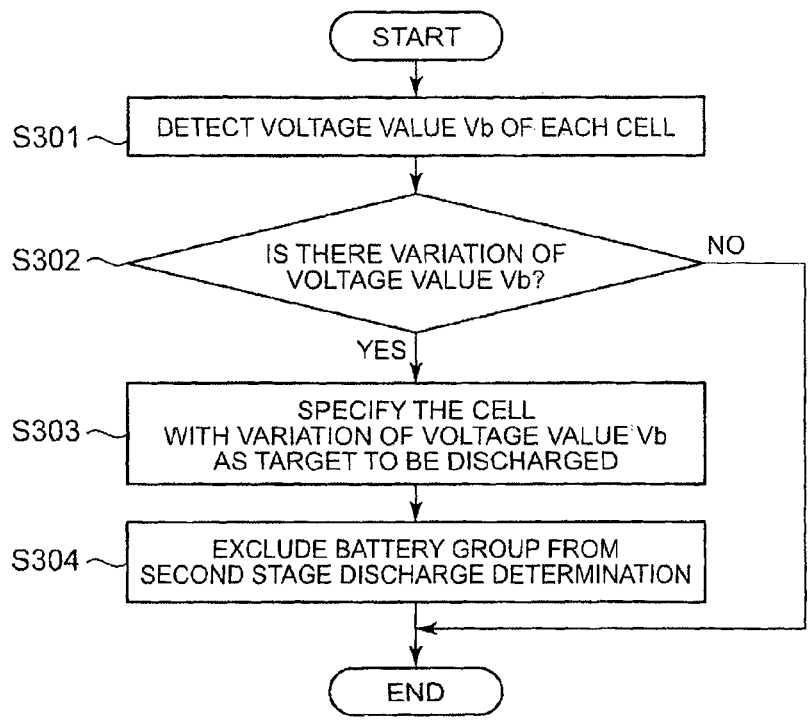
FIG. 7 is a flowchart illustrating first stage discharge determination.

Next, the details of the processing (first stage discharge determination) of Step S201 illustrated in FIG. 5 will be described using the flowchart illustrated in FIG. 7. Processing illustrated in FIG. 7 is executed by the controller 40.

In Step S301, the controller 40 detects the voltage values Vb of all cells 12 included in each of the battery groups G1 to G4 based on the output signals of the monitoring units 30A, 30B. In Step S302, the controller 40 performs determination about whether or not the voltage values Vb are different in each of the battery groups G1 to G4 and variation of the voltage values Vb is generated.

Specifically, the controller 40 first specifies a minimum voltage value Vb_min1 in each of the battery groups G1 to G4. Here, there is at least one cell 12 having the voltage value Vb_min1 in each of the battery groups G1 to G4. Next, the controller 40 calculates the voltage difference ΔV1 between the voltage value Vb of each of the remaining cells 12 and the voltage value Vb_min1.

The remaining cells 12 are the cells 12 that have the voltage value Vb greater than the voltage value Vb_min1. The voltage difference ΔV1 is a value obtained by subtracting the voltage value Vb_min1 from the voltage value Vb of each of the remaining cells 12. When the calculated voltage difference ΔV1 is equal to or greater than a threshold value ΔV_th1, the controller 40 determines that variation of the voltage values Vb is generated. When variation of the voltage values Vb is generated, the controller 40 performs processing of Step S303.

The determination about whether or not variation of the voltage values Vb is generated is performed for all cells 12 excluding the cell 12 having the voltage value Vb_min1 in each of the battery groups G1 to G4. In the battery groups G1 to G4, the voltage values Vb_min1 are optionally different from one another.

When the voltage difference ΔV1 is less than the threshold value ΔV_th1, the controller 40 determines that variation of the voltage values Vb is not generated, in other words, the voltage values Vb are uniform. The threshold value ΔV_th1 is a value equal to or greater than 0 [V] and is able to be appropriately set taking into consideration a range in which variation of the voltage values Vb is allowable. Information specifying the threshold value ΔV_th1 is able to be stored in the memory 41. When variation of the voltage values Vb is not generated, the controller 40 ends the processing illustrated in FIG. 7. In this case, in the first stage discharge determination, a cell 12 to be discharged is not specified.

In Step S303, the controller 40 specifies, as a cell 12 to be discharged, a cell 12 that is determined to have variation of the voltage values Vb by the processing of Step S302. The cell 12 that is specified as a target to be discharged is a cell 12, which has the voltage value Vb greater than the voltage value Vb_min1 by at least the threshold value ΔV_th1, in each of the battery groups G1 to G4.

The controller 40 sets a discharge execution flag for the cell 12 specified as a target to be discharged. If identification information (number or the like) is provided for all cells 12 constituting the assembled battery 10, the controller 40 is able to store the identification information and the discharge execution flag in the memory 41 in association with each other. With this, the controller 40 confirms the identification information and the discharge execution flag, thereby recognizing a cell 12 to be discharged.

When the first stage discharge determination is performed, in the processing of Step S103 illustrated in FIG. 4, the controller 40 discharges the cell 12 for which the discharge execution flag is set. The processing of Step S103 is an example of first processing of the invention. With this, in the battery group G, variation of the voltage values Vb is suppressed, thereby making the voltage values Vb uniform. When performing the processing illustrated in FIG. 4, in the battery group G, the voltage values Vb are optionally not made uniform depending on the discharge amount of each of the cells 12 for the second predetermined time t_th2. However, the processing illustrated in FIG. 4 is repeatedly performed, thereby making the voltage values Vb uniform in the battery group G.

In Step S304, the controller 40 excludes the battery group G including the cell 12 to be discharged specified by the processing of Step S303 from the second stage discharge determination. Specifically, the controller 40 does not set the discharge execution flag for all cells 12 excluding the cell 12 to be discharged in the battery group G including the cell 12 to be discharged. With this, the controller 40 confirms the identification information and the setting content of the discharge execution flag, thereby recognizing a cell 12 not to be discharged. As the cell 12 not to be discharged, there is the cell 12 having the voltage value Vb_min1.

Figure 8:
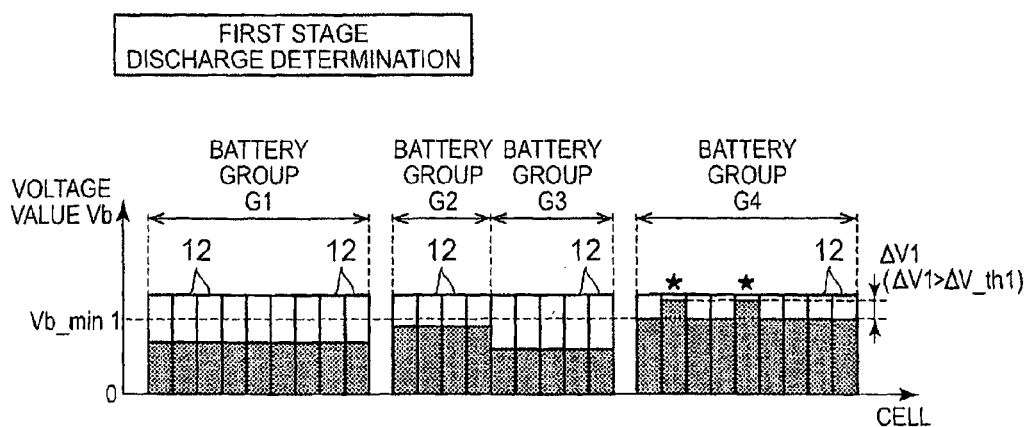
FIG. 8 is an explanatory view when a cell to be discharged is specified in the first stage discharge determination.

FIG. 8 illustrates the voltage values Vb (an example) of the cells 12 in each of the battery groups G1 to G4. The vertical axis of FIG. 8 represents the voltage value Vb, and the horizontal axis of FIG. 8 represents the cell 12.

In the example illustrated in FIG. 8, in the battery group G4, the voltage value Vb of each of cells 12 marked with an asterisk is greater than the voltage values Vb (that is, voltage value Vb_min1) of the remaining cells 12 by at least the threshold value ΔV_th1. For this reason, the cell 12 marked with an asterisk is specified as a target to be discharged in the first stage discharge determination. The battery group G4 is excluded from the second stage discharge determination. In each of the remaining battery groups G1 to G3, since the voltage values Vb of the cells 12 are uniform, in the first stage discharge determination, in each of the battery groups G1 to G3, a cell 12 to be discharged is not specified.

Figure 9:
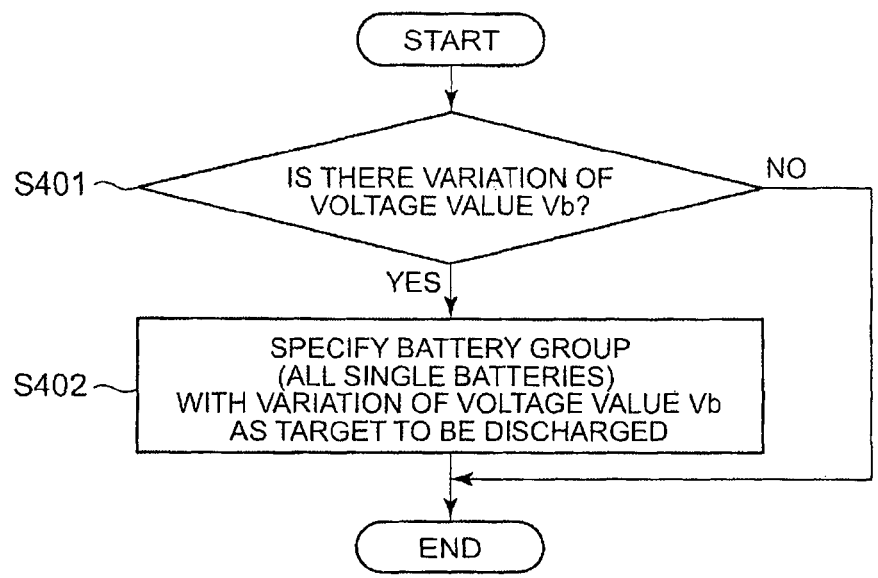
FIG. 9 is a flowchart illustrating second stage discharge determination.

Next, the details of the processing (second stage discharge determination) of Step S202 illustrated in FIG. 5 will be described using the flowchart illustrated in FIG. 9. Processing illustrated in FIG. 9 is executed by the controller 40.

In Step S401, the controller 40 performs determination about whether or not the voltage values Vb are different and variation of the voltage values Vb is generated among a plurality of battery groups G (G1 to G4). A battery group G that is subjected to the processing of Step S401 is a battery group G in which variation of the voltage values Vb is not generated in the first stage discharge determination. In the battery group G, all cells 12 have the voltage difference $\Delta V1$ less than the threshold value $\Delta V\_th1$. For this reason, the voltage values Vb of all cells 12 included in the battery group G are substantially equal.

The controller 40 recognizes the voltage values Vb of the cells 12 included in each battery group G and then performs determination about whether or not variation of the voltage values Vb is generated among a plurality of battery groups G. Specifically, the controller 40 first specifies a minimum voltage value Vb_min2 among the voltage values Vb in a plurality of battery groups G and calculates the voltage difference $\Delta V2$ between the voltage value Vb of each of the remaining battery groups G and the voltage value Vb_min2. The voltage value Vb of each of the remaining battery groups G is greater than the voltage value Vb_min2, and the voltage difference $\Delta V2$ is a value obtained by subtracting the voltage value Vb_min2 from the voltage value Vb of each of the remaining battery groups G.

When the calculated voltage difference $\Delta V2$ is equal to or greater than a threshold value $\Delta V\_th2$, the controller 40 determines that variation of the voltage values Vb is generated in a plurality of battery groups G. When variation of the voltage values Vb is generated, the controller 40 performs processing of Step S402.

The threshold value $\Delta V\_th2$ is a value equal to or greater than 0 [V] and is able to be appropriately set taking into consideration a range in which variation of the voltage values Vb is allowable. The threshold value $\Delta V\_th2$ is optionally the same as or is optionally different from the above-described threshold value $\Delta V\_th1$. Information specifying the threshold value $\Delta V\_th2$ is able to be stored in the memory 41.

The determination about whether or not variation of the voltage values Vb is generated is performed for all battery groups G excluding the battery group G having the voltage value Vb_min2. However, as described above, the processing of S401 is not performed for the battery group G excluded from the second stage discharge determination by the processing illustrated in FIG. 7.

When the calculated voltage difference $\Delta V2$ is less than the threshold value $\Delta V\_th2$, the controller 40 determines that variation of the voltage values Vb is not generated, in other words, the voltage values Vb are uniform. In this case, the controller 40 ends the processing illustrated in FIG. 9. When there is only one battery group G that is subjected to the processing of Step S401, since variation of the voltage values Vb is unable to be recognized, the controller 40 ends the processing illustrated in FIG. 9.

When variation of the voltage values Vb is generated in a plurality of battery groups G, the controller 40 specifies, as a cell 12 to be discharged, all cells 12 included in the battery group G that is determined to have variation of the voltage values Vb. In the battery group G that is determined to have variation of the voltage values Vb, the voltage values Vb of the cells 12 included in the battery group G become greater than the voltage value Vb_min2 by at least the threshold value $\Delta V\_th2$.

As in the processing of Step S303 illustrated in FIG. 7, the controller 40 sets a discharge execution flag for the cells 12 specified as a target to be discharged. The setting content of the discharge execution flag is able to be stored in the memory 41 in association with the identification information of the cells 12.

When the discharge execution flag is set for all cells 12 included in the battery group G, all cells 12 in the battery group G are discharged by the processing of Step S103 illustrated in FIG. 4. The processing of S103 is an example of second processing of the invention. As described above referring to FIG. 3, since each cell 12 is connected to the same resistive elements R11, R21, R22, the discharge amount of each cell 12 per unit time becomes equal in all cells 12. That is, in all cells 12 of the battery group G, the voltage values Vb are lowered in a state where the voltage values Vb are uniform.

When performing the processing illustrated in FIG. 4, the voltage values Vb are optionally not made uniform in a plurality of battery groups G depending on the discharge amount of each of the cells 12 for the second predetermined time t_th2. However, the processing illustrated in FIG. 4 is repeatedly performed, and the voltage values Vb are able to be made uniform in a plurality of battery groups G.

Figure 10:
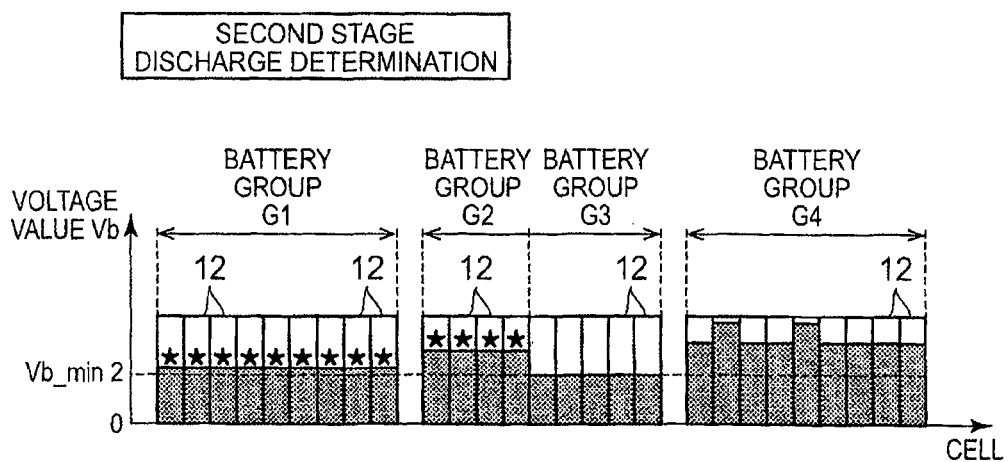
FIG. 10 is an explanatory view when a cell to be discharged is specified in the second stage discharge determination.

FIG. 10 illustrates the voltage values Vb (an example) of the cells 12 in each of the battery groups G1 to G4. FIG. 10 corresponds to FIG. 8.

In the example illustrated in FIG. 10, the voltage values Vb of each of the battery groups G1, G2 are greater than the voltage values Vb of the battery group G3, that is, the voltage value Vb_min2 by at least the threshold value $\Delta V\_th2$. For this reason, cells 12 marked with an asterisk in FIG. 10 are specified as a target to be discharged. All cells 12 of the battery groups G1, G2 are specified as a target to be discharged. The cells 12 included in the battery group G3 are excluded from a target to be discharged.

According to this example, the cells 12 that are specified as a target to be discharged by the first stage discharge determination and the second stage discharge determination are discharged. In the examples illustrated in FIGS. 8 and 10, the cells 12 marked with an asterisk are discharged.

The cell 12 that is specified as a target to be discharged by the first stage discharge determination is discharged, whereby it is possible to suppress variation of the voltage values Vb in all cells 12 of the battery group G. In the example illustrated in FIG. 8, it is possible to make the voltage values Vb of all cells 12 in the battery group G4 uniform with the voltage value Vb_min1. In the battery group G4, after the voltage values Vb of all cells 12 are made uniform with the voltage value Vb_min1, the second stage discharge determination is performed.

The cells 12 specified as a target to be discharged by the second stage discharge determination are discharged, whereby it is possible to suppress variation of the voltage values Vb in all battery groups G subjected to the second stage discharge determination. In the example illustrated in FIG. 10, it is possible to make the voltage values Vb of all cells 12 in the battery groups G1 to G3 uniform with the voltage value Vb_min2.

As described above, while the voltage values Vb of all cells 12 in the battery group G4 are made uniform with the voltage value Vb_min1, the voltage value Vb_min1 is greater than the voltage value Vb_min2. For this reason, the cells 12 in the battery group G4 are specified as the cells to be discharged by the the second stage discharge determination, after the voltage values Vb are made uniform with the voltage value Vb_min1. And then, all cells 12 included in the battery group G4 are discharged by the second processing, and the voltage values Vb of all cells 12 included in the battery group G4 are made uniform with the voltage value Vb_min2.

As a result, in the assembled battery 10 (all battery groups G1 to G4), the voltage values Vb of all cells 12 are made uniform with the voltage value Vb_min2, whereby it is possible to suppress variation of the voltage values Vb. In this way, according to this example, it is possible to suppress variation of the voltage values Vb in the assembled battery 10 while suppressing variation of the voltage values Vb in each of the battery groups G1 to G4.

When suppressing variation of the voltage values Vb in the assembled battery 10, first, variation of the voltage values Vb in each battery group G is suppressed. Accordingly, in each battery group G, determination about whether or not an abnormal state described below is generated is easily performed.

In the cell 12, if minute short-circuiting is generated between the positive electrode and the negative electrode, the cell 12 continues to be discharged. It is preferable to perform determination early about whether or not the abnormal state is generated even when the equalization processing illustrated in FIG. 4 is performed.

If variation of the voltage values Vb in a plurality of cells 12 is suppressed, the lowering (voltage fluctuation) of the voltage value Vb associated with minute short-circuiting is easily recognized. That is, if minute short-circuiting is generated in a specific cell 12, the voltage value Vb of the specific cell 12 is lower than the uniform voltage values Vb of the remaining cells 12, and thus it is easily determined that an abnormal state, such as minute short-circuiting, is generated.

Figure 11:
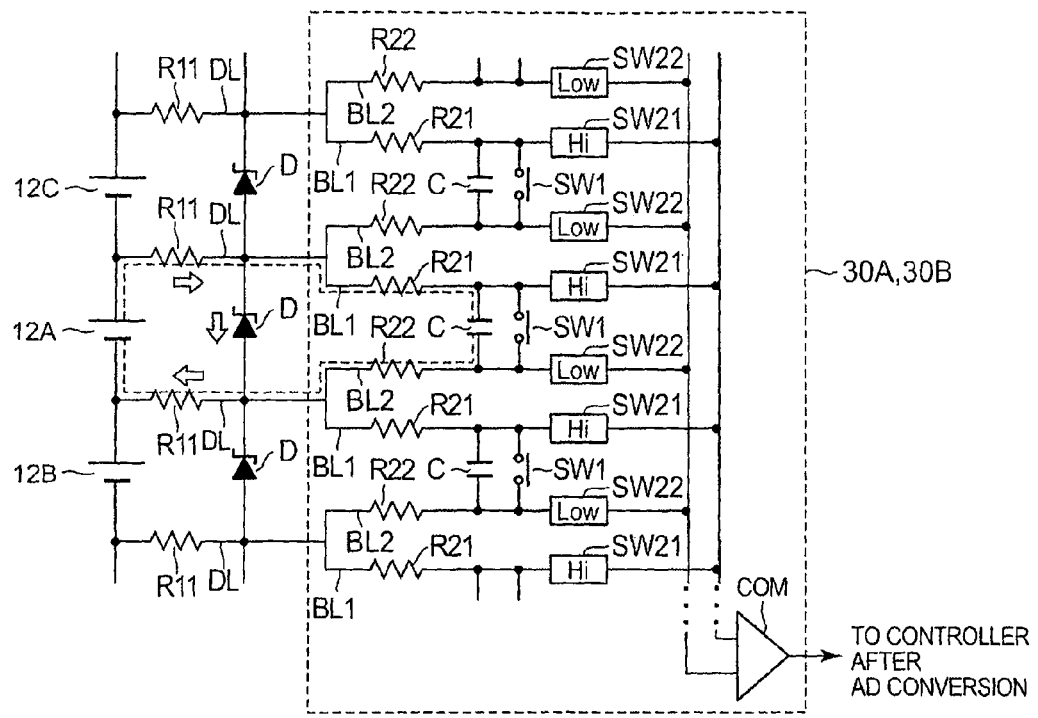
FIG. 11 is a diagram illustrating a state in which a leakage current flows in a Zener diode.

In the circuit configuration illustrated in FIG. 3, if the Zener diode D fails, as indicated by arrows of FIG. 11, a leakage current optionally flows in the Zener diode D. At this time, the voltage value Vc of the capacitor C on a current path indicated by a thick dotted line of FIG. 11 is lower than the voltage value Vb of the cell 12A. If a leakage current does not flow in the Zener diode D, the voltage value Vc becomes equal to the voltage value Vb.

The voltage value Vc output from the comparator COM is expressed by Expression (1).

[Equation 1]

$$Vc = Vb - 2 \times I\_leak \times R \quad (1)$$

In Expression (1), I_leak is the value of a leakage current flowing in the Zener diode D. R is a resistance value of the resistive element R11. "I_leak×R" represents the amount of voltage drop associated with the flowing of a leakage current in the resistive element R11. In a path indicated by the arrows of FIG. 11 in which a leakage current flows, two resistive elements R11 are provided, and thus the amount of voltage drop becomes two times "I_leak×R".

As illustrated in Expression (1), the voltage value Vc is lower than the actual voltage value Vb of the cell 12A. For this reason, if the charging/discharging of the cell 12 (assembled battery 10) is controlled based on the voltage value Vc, there is a concern that the cell 12A is overcharged. When controlling the charging of the cell 12, the charging of the cell 12 is controlled such that the voltage value Vc is not greater than an upper limit voltage value determined in advance.

If the voltage value Vc is less than the voltage value Vb of the cell 12A, there is a concern that the charging of the cell 12A is performed until the voltage value Vc reaches the upper limit voltage value. Since the voltage value Vb is greater than the voltage value Vc, when the voltage value Vc reaches the upper limit voltage value, there is a concern that the voltage value Vb exceeds the upper limit voltage value and the cell 12A is overcharged. It is preferable to perform determination early about whether or not the abnormal state is generated even when the processing illustrated in FIG. 4 is performed.

As illustrated in FIG. 11, when a leakage current flows in the Zener diode D corresponding to the cell 12A, the voltage value Vc of the capacitor C corresponding to each of the cells 12B, 12C is raised by "I_leak×R". For this reason, if the relationship between a voltage drop (voltage fluctuation) of "2×I_leak×R" and a voltage rise (voltage fluctuation) of "I_leak×R" is able to be specified, it is able to be determined that the Zener diode D fails. Each of the cells 12B, 12C is the cell 12 connected in series with the cell 12A. In other words, the positive electrode terminal of the cell 12B is connected to the negative electrode terminal of the cell 12A, and the negative electrode terminal of the cell 12C is connected to the positive electrode terminal of the cell 12A.

As described above, in order to determine failure of the Zener diode D, it is necessary to suppress variation of the voltage values Vb in advance in a plurality of cells 12. If the voltage values Vb of a plurality of cells 12 are made uniform with a reference voltage value (arbitrary value) Vref, thereafter, when the Zener diode D fails, the voltage value Vc detected by the monitoring unit 30 has a relationship illustrated in FIG. 12.

Figure 12:
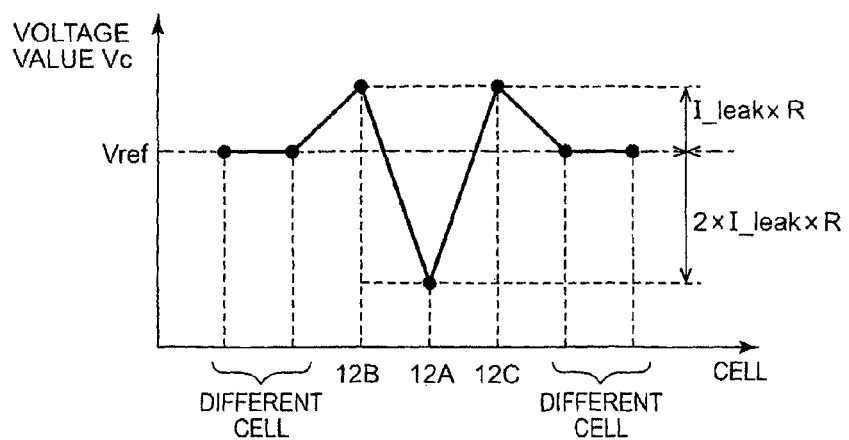
FIG. 12 is a diagram illustrating the relationship of voltage values of cells when a leakage current flows in a Zener diode.

As illustrated in FIG. 12, the voltage value Vc of the cell 12A corresponding to the failed Zener diode D is less than the reference voltage value Vref by "2×I_leak×R". The voltage value Vc of each of the cells 12B, 12C is greater than the reference voltage value Vref by "I_leak×R". For this reason, when the voltage difference between the voltage value Vc of the cell 12A and the reference voltage value Vref and the voltage difference between the voltage value Vc of at least one of the cells 12B, 12C and the reference voltage value Vref have a relationship illustrated in FIG. 12, it is able to be determined that the Zener diode D corresponding to the cell 12A fails.

Even if the voltage difference with respect to the reference voltage value Vref is not confirmed, it is optionally possible to determine failure of the Zener diode D. Specifically, it is optionally only confirmed that the voltage value Vc of the cell 12A is less than the reference voltage value Vref and the voltage value Vc of at least one of the cells 12B, 12C is greater than the reference voltage value Vref. In this case, it is able to be determined that the Zener diode D corresponding to the cell 12A fails. However, as described above, the voltage difference to the reference voltage value Vref is confirmed, whereby it is possible to determine failure of the Zener diode D with high precision. The controller 40 performs processing for determining a specific cell continuing to be discharged due to minute short-circuiting described above or failure of the Zener diode D as an abnormal state. The processing for determining an abnormal state is executed after the first processing is performed.

If the voltage values Vb (voltage values Vc) of a plurality of cells 12 are made uniform with the reference voltage value Vref, it is not possible to recognize the relationship of the voltage values Vc illustrated in FIG. 12, and it is not possible to determine failure of the Zener diode D. Accordingly, in order to determine failure of the Zener diode D, as described above, it is necessary to suppress variation of the voltage values Vb (voltage values Vc) in a plurality of cells 12.

When suppressing variation of the voltage values Vb in a plurality of cells 12, as in this example, a plurality of cells 12 are divided into a plurality of battery groups G, and it is possible to suppress variation of the voltage values Vb in each battery group G.

As a method of suppressing variation of the voltage values Vb, in all cells 12 constituting the battery stack 11, suppressing variation of the voltage values Vb or suppressing variation of the voltage values Vb in all cells 12 connected to one monitoring unit 30 is considered. However, in these cases, defects described below occur.

In the configuration illustrated in FIG. 6, the battery stack 11B includes the battery group G2 connected to the monitoring unit 30A and the battery group G3 connected to the monitoring unit 30B. A detection error optionally occurs in each of the monitoring units 30A, 30B, and the detection error optionally differs according to the monitoring units 30A, 30B.

In this case, although the voltage values Vb of all cells 12 included in the battery stack 11B are actually equal, the voltage value Vb detected by the monitoring unit 30A and the voltage value Vb detected by the monitoring unit 30B are different due to the difference in the detection error described above. In all cells 12 constituting the battery stack 11B, when suppressing variation of the voltage values Vb, variation in the voltage values Vb caused by the difference in the detection error between the monitoring units 30A, 30B is suppressed.

Accordingly, until variation of the voltage values Vb caused by the difference in the detection error between the monitoring units 30A, 30B is suppressed, it is not possible to perform the determination of an abnormal state described above. In other words, it takes time until the determination of an abnormal state is able to be performed.

In this example, processing for suppressing variation of the voltage values Vb in each of the battery groups G2, G3 illustrated in FIG. 6 is performed by the first stage discharge determination and the first processing. For this reason, in the first stage discharge determination and the first processing, it is not necessary to suppress variation of the voltage values Vb caused by the difference in the detection error between the monitoring units 30A, 30B. Therefore, it is possible to reduce the time until variation of the voltage values Vb is suppressed and to perform the determination of the abnormal state described above in earlier timing.

The cells 12 of different battery stacks 11 are optionally connected to one monitoring unit 30. For example, as illustrated in FIG. 6, the battery stack 11A (battery group G1) and the battery group G2 included in the battery stack 11B are connected to the monitoring unit 30A.

In the battery stacks 11A, 11B, variation in the deterioration state of the cells 12 is generated, whereby the cells 12 are optionally different in full charging capacity. For example, if a temperature environment or the like is different around the battery stacks 11A, 11B, in the battery stacks 11A, 11B, variation in the deterioration state of the cells 12 is optionally generated. Each battery stack 11 is able to be replaced individually, and thus, as described above, if one of the battery stacks 11A, 11B is replaced with a different battery stack 11, in the battery stacks 11A, 11B, variation in the deterioration state of the cells 12 is generated.

If variation in the full charging capacity of the cells 12 is generated, variation of the voltage values Vb is likely to be generated. For example, when two cells 12 having different full charging capacities are charged with the same current amount, the amount of voltage rise in the cell 12 having a small full charging capacity becomes greater than the amount of voltage rise in the cell 12 having a large full charging capacity. When two cells 12 having different full charging capacities are discharged with the same current amount, the amount of voltage decrease in the cell 12 having a small full charging capacity becomes greater than the amount of voltage decrease in the cell 12 having a large full charging capacity. In this way, variation of the voltage values Vb depends on variation in the full charging capacity of the cells 12.

In all cells 12 included in the battery groups G1, G2 illustrated in FIG. 6, when suppressing variation of the voltage values Vb, variation of the voltage values Vb due to variation in the full charging capacity described above should also be suppressed. In this example, variation of the voltage values Vb in each of the battery groups G1, G2 is suppressed based on the first stage discharge determination. For this reason, in the first stage discharge determination and the first processing, it is not necessary to suppress variation of the voltage values Vb due to variation in the full charging capacity. Therefore, it becomes easy to reduce the time until variation of the voltage values Vb is suppressed, and it is possible to perform the determination of the abnormal state described above in earlier timing.

According to this example, it is possible to suppress variation of the voltage values Vb in the assembled battery 10 while making it easy to perform the determination of the abnormal state described above in a state in which variation of the voltage values Vb in each battery group G is suppressed.

The invention is not limited to the configuration illustrated in FIG. 6. For example, the invention is optionally applied to a configuration in which one battery stack 11 is connected to a plurality of monitoring units 30. In this case, the cells 12 included in one battery stack 11 are optionally divided into a plurality of battery groups G according to a plurality of monitoring units 30. The number of battery groups G becomes equal to the number of monitoring units 30.

The invention is optionally applied to a configuration in which one monitoring unit 30 is connected to a plurality of battery stacks 11. In this case, the cells 12 of each battery stack 11 are optionally divided into a plurality of battery groups G. The number of battery groups G becomes equal to the number of battery stacks 11. As described above, if the battery groups G are set and then the same processing as in this example is performed, the same effects as in this example are able to be obtained.

In this example, although the monitoring unit 30 detects the voltage value Vb of each cell 12, the invention is not limited thereto. For example, when one battery Module is constituted by a plurality of cells 12 connected in series, the monitoring unit 30 is able to detect the voltage value of each battery module. The battery modules are an example of power storage elements of the invention. A plurality of battery modules are connected in series, whereby one battery stack 11 is constituted. In this case, it is possible to suppress variation of the voltage values in a plurality of battery modules.

In this example, the cells 12 to be discharged are specified based on the first stage discharge determination and the second stage discharge determination, and all cells 12 that are specified as a target to be discharged are discharged in the processing of Step S103 illustrated in FIG. 4. The timing of discharging the cells 12 is able to be appropriately set. Specifically, the processing (first processing) for making the voltage values Vb in the battery group G uniform and the processing (second processing) for making the voltage values Vb of a plurality of battery groups G uniform are optionally performed simultaneously or are optionally performed in different timing in an order of the first processing and the second processing. In FIG. 5, the first stage discharge determination and the second stage discharge determination are performed continuously. Meanwhile, the first processing is optionally performed after the first stage discharge determination is performed, and thereafter, the second stage discharge determination is optionally performed. In this case, in the flowchart of FIG. 4, after the first stage discharge determination and the first processing are executed, the second stage discharge determination and the second processing are repeated. When the first processing and the second processing are performed in different timing, it is not necessary to perform S304.

The invention claimed is:

1. A power storage system comprising:
a power storage device that includes a plurality of power storage stacks connected in series, each power storage stack of said plurality of power storage stacks including a plurality of power storage elements connected in series;
a plurality of voltage detection circuits configured to detect voltage values of the plurality of power storage elements, respectively;
a discharge circuit configured to perform a discharge processing for discharging each power storage element; and
a controller configured to control the discharge processing based on the voltage values detected by the voltage detection circuits, the controller configured to determine an abnormal state according to a voltage fluctuation after the voltage values are made uniform, the controller configured to perform a first processing when all conditions i) to iv) given below are satisfied, and the controller configured to perform a second processing when all the conditions i) to iii) and a condition v) given below are satisfied, the conditions are:
i) in at least one power storage stack, different voltage detection circuits are connected to the power storage elements included in said at least one power storage stack,
ii) at least one voltage detection circuit is connected to the power storage elements of different power storage stacks,
iii) the power storage elements included in the plurality of power storage stacks are divided into a plurality of groups, each group consists of a plurality of power storage elements included in a same power storage stack and connected to a same voltage detection circuit,
iv) the voltage values of the power storage elements are different in each group, and
v) in the plurality of groups in each of which the voltage values of the power storage elements are made uniform, the voltage values are different among the plurality of groups,
the first processing is processing for making the voltage values of the power storage elements in the group corresponding to the condition iv) uniform by the discharge processing, and the second processing is processing for making the voltage values of the power storage elements included in the plurality of groups corresponding to the condition v) uniform by the discharge processing.

2. The power storage system according to claim 1, the power storage system further comprising:
a Zener diode that is connected to each power storage element through a wire connecting said each power storage element and the voltage detection circuit and has a cathode connected to a positive electrode terminal of said each power storage element and an anode connected to a negative electrode terminal of said each power storage element,
wherein the controller is configured to determine, as the abnormal state, that a leakage current flows in the Zener diode corresponding to a specific power storage element when conditions vi) to viii) given below are satisfied, the conditions are:
vi) the voltage values of the power storage elements in said each group have been made uniform with a reference voltage value,
vii) the voltage value of the specific power storage element is less than the reference voltage value, and
viii) the voltage value of the power storage element connected in series with the specific power storage element is greater than the reference voltage value.

3. The power storage system according to claim 1,
wherein the controller is configured to determine, as the abnormal state, that a specific power storage element continues to be discharged when conditions ix) and x) given below are satisfied, the conditions are:
ix) the voltage values of the power storage elements in said each group have been made uniform with a reference voltage, and
x) the voltage value of the specific power storage element is less than the reference voltage.

4. A power storage system comprising:
a power storage stack that includes a plurality of power storage elements connected in series;
a plurality of voltage detection circuits connected to different power storage elements in the power storage stack, the plurality of voltage detection circuits configured to detect voltage values of the plurality of power storage elements, respectively;
a discharge circuit configured to perform a discharge processing for discharging each power storage element;
a controller configured to control the discharge processing based on the voltage values detected by the voltage detection circuits, the controller configured to determine an abnormal state according to a voltage fluctuation after the voltage values are made uniform, the controller configured to perform a first processing when conditions i) and ii) given below are satisfied, and the controller configured to perform a second processing when the condition i) and a condition iii) given below are satisfied, the conditions are:
i) the power storage elements are divided into a plurality of groups, each group consists of a plurality of power storage elements connected to a same voltage detection circuit,
ii) the voltage values of the power storage elements are different in each group, and
iii) in the plurality of groups in each of which the voltage values of the power storage elements are made uniform, the voltage values are different among the plurality of groups, the first processing is processing for making the voltage values of the power storage elements in the group corresponding to the condition ii) uniform by the discharge processing, and the second processing is processing for making the voltage values of the power storage elements included in the plurality of groups corresponding to the condition iii) uniform by the discharge processing.

5. A power storage system comprising:

a power storage device that includes a plurality of power storage stacks connected in series, each of the power storage stacks including a plurality of power storage elements connected in series;

a voltage detection circuit configured to detect a voltage value of each power storage element;

a discharge circuit configured to perform a discharge processing for discharging each power storage element; and a controller configured to control the discharge processing based on the voltage values detected by the voltage detection circuits, the controller configured to determine an abnormal state according to a voltage fluctuation after the voltage values are made uniform, the controller configured to perform a first processing when conditions i) and ii) given below are satisfied, and the controller configured to perform a second processing when the condition i) and a condition iii) given below are satisfied, the conditions are:

i) the power storage elements are divided into a plurality of groups, each group having the power storage elements included in a same power storage stack, ii) the voltage values of the power storage elements are different in each group, and iii) in the plurality of groups in each of which the voltage values of the power storage elements are made uniform, the voltage values are different among the plurality of groups, the first processing is processing for making the voltage values of the power storage elements in the group corresponding to the condition ii) uniform by the discharge processing, and the second processing is processing for making the voltage values of the power storage elements included in the plurality of groups corresponding to the condition iii) uniform by the discharge processing.

* * * * *